United States Patent
Kawazu

(10) Patent No.: US 8,339,502 B2
(45) Date of Patent: Dec. 25, 2012

(54) IMAGING DEVICE MANUFACTURING METHOD AND IMAGING DEVICE

(75) Inventor: Keiichi Kawazu, Sagamihara (JP)

(73) Assignee: Konica Minolta Opto, Inc., Tokyo (JP)

( * ) Notice: Subject to any disclaimer, the term of this patent is extended or adjusted under 35 U.S.C. 154(b) by 597 days.

(21) Appl. No.: 12/595,920

(22) PCT Filed: Apr. 7, 2008

(86) PCT No.: PCT/JP2008/056886
§ 371 (c)(1),
(2), (4) Date: Oct. 14, 2009

(87) PCT Pub. No.: WO2008/132979
PCT Pub. Date: Nov. 6, 2008

(65) Prior Publication Data
US 2010/0165172 A1    Jul. 1, 2010

(30) Foreign Application Priority Data
Apr. 17, 2007 (JP) .................. 2007-108068

(51) Int. Cl.
*H04N 5/225* (2006.01)
*H01L 31/232* (2006.01)
(52) U.S. Cl. ......... 348/340; 348/360; 348/374; 257/432
(58) Field of Classification Search .................. 348/340, 348/360, 374; 257/432
See application file for complete search history.

(56) References Cited

U.S. PATENT DOCUMENTS

| | | | |
|---|---|---|---|
| 8,189,277 B2* | 5/2012 | Kintz et al. | 359/797 |
| 2005/0161587 A1* | 7/2005 | Mihara et al. | 250/214 R |
| 2006/0077281 A1* | 4/2006 | Hasegawa | 348/360 |
| 2008/0073734 A1 | 3/2008 | Kong | |

FOREIGN PATENT DOCUMENTS

| | | |
|---|---|---|
| EP | 1 244 151 | 9/2002 |
| EP | 1 434 426 | 6/2004 |
| JP | 2002-290842 | 10/2002 |
| JP | 2004-200965 | 7/2004 |
| JP | 2004-260356 | 9/2004 |
| JP | 2005-176185 | 6/2005 |
| WO | WO 2005/041561 | 5/2005 |
| WO | WO 2006/109638 | 10/2006 |

* cited by examiner

*Primary Examiner* — Chieh M Fan
*Assistant Examiner* — Quang Le
(74) *Attorney, Agent, or Firm* — Cozen O'Connor

(57) ABSTRACT

Provided are a method for manufacturing an imaging device at low cost while ensuring easiness in manufacturing, and the imaging device. In the imaging device, a diaphragm 14a can be used as a diaphragm by insert molding a metal plate material MP in a transparent resin material which forms a lens, a diaphragm as a separate member is not required to be assembled, and troubles in assembly are eliminated. Further, a shield of an imaging element can be grounded by assembling a lens array LA to an imaging element array IA while making a leg section 14b abut to an earth terminal T1g. Thus, wire connection by soldering is eliminated and troubles in assembly are eliminated.

10 Claims, 3 Drawing Sheets

IMAGING DEVICE MANUFACTURING METHOD AND IMAGING DEVICE

RELATED APPLICATIONS

This is a U.S. National Phase Application under 35 U.S.C. 371 of International Application PCT/JP2008/056886, filed on Apr. 7, 2008.

This application claims the priority of Japanese Application No. 2007-108068 filed on Apr. 17, 2007, the entire content of which is hereby incorporated by reference.

TECHNICAL FIELD

The present invention relates to a manufacturing method of a compact imaging device suitable for being installed in, for example, a mobile phone, and an imaging device.

BACKGROUND

In recent years, developments of mobile phones and handy personal computers (mobile personal computer) in which compact cameras are installed have been advanced. For example, the mobile phone provided with the compact camera can capture an image of the calling party as image data by a built-in camera and transmit the image data to an intended party. Such compact camera is generally configured with an image sensor and a lens. Namely the lens forms an optical image on the image sensor and the image sensor can create an electric signal corresponding to the optical image.

Meanwhile, further downsizing of the mobile phones and handy personal computers is being advanced, thus downsizing of the compact camera used in the above equipment is being required. To fulfill the demands of downsizing of such cameras, camera modules configured by integrating the lens and the camera module are being developed.

In Patent Document 1 (Unexamined Japanese Patent Application Publication No. 2004-200965), a camera module manufacturing method base on the following manufacturing processes is disclosed. In accordance with the following manufacturing processes of the prior art, an image sensor wafer configured by disposing a plurality of image sensor chips, and a lens array in a shape of a wafer configured by disposing a plurality of lenses having the same size as that of the image sensor chip are prepared first. After that, the lens array is bonded on a surface of the image sensor wafer. Further, the bonded wafers in which the image sensor wafer and the lens array are disposed are cut along cutting grooves so as to separate individual camera modules. Whereby, manufacturing processes are simplified.

Unexamined Japanese Patent Application Publication No. 2004-200965

DISCLOSURE OF THE INVENTION

Problems to be Resolve by the Invention

Meanwhile, in accordance with progress of imaging elements of higher resolution, frequency of operation clock becomes higher which may negatively affects communication of the mobile phone. Therefore, there is a demand to cover a periphery of the imaging element with a conductive shield, however there is an issue of how to ground the shield. For example, in a technology of Patent Document 1, the periphery of the imaging element of each camera module after separating is covered by a housing, and the housing is connected with an earth terminal by soldering. However the above method is laborious. Also, in case a diaphragm of optical system is prepared and installed as a separate part, there is also a problem of laboriousness.

The present invention has one aspect to solve the above problems and an object of the present invention is to provide a manufacturing method to manufacture an imaging device economically while ensuring easiness of manufacturing.

Means to Resolve the Problems

An imaging device manufacturing method described in Claim 1 includes:

forming a plurality of openings and a plurality of leg sections at a metal plate;

forming a lens array through insert molding wherein the metal plate is inserted in a transparent resin which forms a lens;

forming an imaging element array wherein imaging elements having earth terminals are disposed in a shape of an array;

assembling the lens array with the imaging element array while contacting the leg section with the earth terminal; and forming an imaging device provided with a pair of the lens and the imaging element by cutting the lens array and the imaging element array.

According to the present invention by molding the metal plate through insert molding to include the opening within the transparent resin material which from a lens, the opening can be used as a diaphragm without assembling an diaphragm as a separate member, thus labors of assembling can be saved. In addition, by assembling the lens array onto the imaging element array while contacting the leg section with the earth terminal, the shield of the imaging element can be grounded without connecting by soldering, thus labors of assembling can be saved.

The imaging device manufacturing method described in Claim 2 is based on that described in Claim 1 further characterized in that the lens of the lens array and the imaging element of the imaging element array are positioned within the prescribed range by the leg section in an optical axis direction. Whereby, for example, there is an advantage that only by assembling the lens array with the imaging element array while contacting the leg section to the earth terminal, focusing can be performed accurately.

The imaging device manufacturing method described in Claim 3 is based on that described in Claim 1 or 2 further characterized in that a bottom surface of the leg section of the lens array is grinded before assembling the lens array with the imaging element array. Whereby, focusing can be performed more accurately.

The imaging device manufacturing method described in Claim 4 is based on that described in any one of Claims 1 to 3 further characterized in that the lens array is formed through two-color molding using a transparent resin material to form the lens and a black color resin material to form a lens frame. Whereby, labors to assemble the lens with the lens frame can be saved.

The imaging device manufacturing method described in Claim 5 is based on that described in any one of Claims 1 to 4 further characterized in that the resin material has a heat resistance property. Since the resin material has the heat resistance property, the soldering on the substrate through a solder reflow bath is possible.

The imaging device manufacturing method described in Claim 6 is based on that described in any one of Claims 1 to 5 further characterized in that the imaging device is provided with three leg sections at a circumference of one opening. Whereby, a preferable balance can be ensured.

The imaging device manufacturing method described in Claim 7 is based on that described in any one of Claims 1 to 6 further characterized in that a conductive paint is applied onto a circumference of the imaging device so that the conductive paint contacts a part of the metal plate exposed by cutting the lens array. Whereby, the conductive paint contacts with the metal plate and is connected with the earth terminal via the leg section.

An imaging device described in Claim 8 includes:

an imaging element mounted on the substrate, provided with a light receiving surface on which pixels are disposed;

a lens to form an image of an object on the light receiving surface of the imaging element; and a conductive diaphragm member included in the lens, wherein the diaphragm member is connected with an earth terminal of the substrate.

According to the present invention, by including the aforesaid conductive diaphragm member in the lens (for example, through insert molding), the diaphragm does not have to be installed as the separate member and the labor of installation can be saved. Further, by contacting a conductive diaphragm member with the earth terminal of the substrate, the shield of the imaging element can be grounded, thus installation of the shield member as a separate member is not necessary, which reduces number of the parts, compactifies the configuration and saves the labor of installation.

EFFECT OF THE INVENTION

According to the present invention, there are provided a manufacturing method to manufacture an economical imaging device while maintaining manufacturing easiness and an imaging device.

Figure 1:
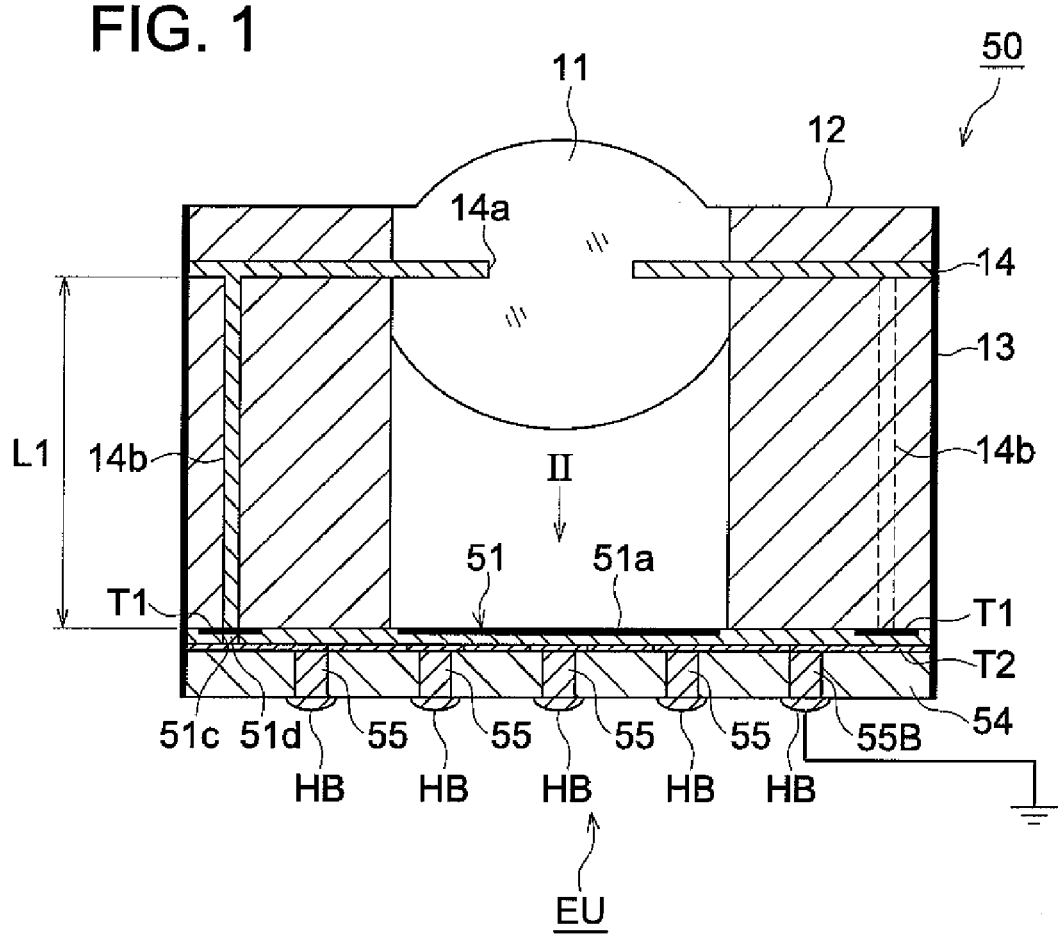
FIG. 1 is a cross-sectional view of an imaging device 50 related to the present embodiment.

DESCRIPTION OF THE SYMBOLS 11 lens
12 lens frame
13 conductive paint
14 metal plate
14a opening
14b leg section
50 imaging device
51 image sensor
51a photoelectric conversion section
51c through hole
51d conductive member
54 resin plate
55 conductive member
DB dicing blade
HB solder ball
IA imaging element array
LA lens array
LM lower mold
MP metal plate material
T1 terminal
T1g EARTH terminal
T2 wiring layer
UM upper mold

DESCRIPTION OF THE PREFERRED EMBODIMENTS

Figure 2:
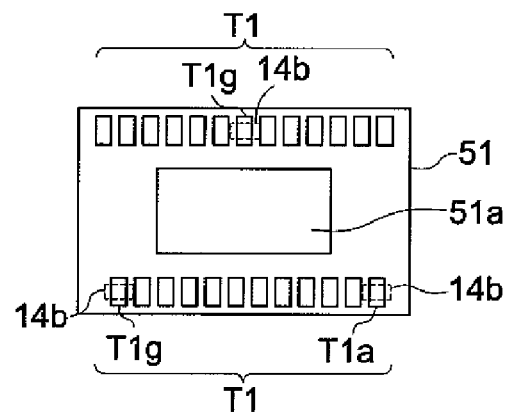
FIG. 2 is a view observed from an arrow II direction in FIG. 1.

Embodiments of the present invention will be described with reference to the drawings as follow. FIG. 1 is a cross-sectional view of the imaging device 50 related to the present embodiment. FIG. 2 is a view of the imaging element observed from an arrow II direction in FIG. 1.

An imaging device 50 has an image sensor 51 representing an imaging element. In FIG. 1, at a center section of the plane at a light receiving side of the image sensor 51, there is formed a photoelectric conversion section 51a representing a light receiving section in which pixels (photoelectric conversion elements) are disposed two-dimensionally, and a signal processing circuitry section (unillustrated) is formed in a periphery thereof.

The signal processing circuitry section, not shown by figures in detail, is provided with a drive circuitry section to obtain the signal charge by sequentially driving each pixel, an A/D conversion section to convert each signal charge into a digital signal and a signal processing section to create an image signal output using the digital signal thereof, which are configured to communicate signals with an outside via a terminal TI (sensor pad) on the surface.

Also, a through hole 51c is formed from a plane surface (obverse surface) of a light receiving side of the image sensor 51 to a reverse surface. The image sensor 51 is grinded to be around 100 μm in a thickness, thus there is less possibility to be damaged when the through hole 51c is formed. A part of terminal T1 in the obverse surface side and a part of a wiring layer T2 on the reverse surface side are conducted each other via a conductive member 51d disposed in the through hole 51c.

A resin plate 54 for reinforcement is bonded on a reverse surface of the image sensor 51. In the resin plate 54, a plurality of conductive member 55 are formed through insert molding. An upper end of the conductive member 55 is in contact with the wiring layer T2 on the reverse surface side and a lower end side of the conductive member 55 is in contact with a solder ball HB. The solder ball HB is melted by passing through a high temperature solder reflow bath along with the imaging device 50 while being placed on an unillustrated substrate and establishes an electric conductance in respect to wiring of the substrate. Whereby, wiring from the substrate to the image sensor 51 can be accomplished. The image sensor 51 and the resin plate 54 configure an element unit.

The image sensor 51 converts the signal charge from the photoelectric conversion section 51a into the image signal and outputs to a prescribed circuitry on the substrate via the conductive member 55. Incidentally, the imaging element is not limited to the CMOS type image sensor and a CCD and other types can be utilized.

In FIG. 1, a lens frame 12 in a shape of a cylinder having the heat resistance property formed by a black resin material is in contact with a circumference of the image sensor 51 at a lower end thereof. At an upper part of inside the lens frame 12, a lens 11 having heat resistance property is formed with a transparent resin, and at an outer circumference of the lens frame 12, a conductive paint 13 is applied. Inside the lens frame 12 and the lens 11, a metal plate 14 is inserted, and an opening 14a of the metal plate 14 configures an aperture of the lens 11.

Figure 3:
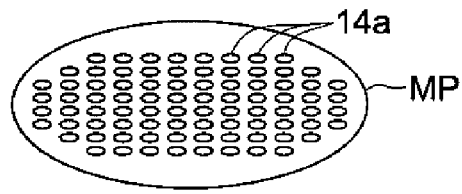
FIG. 3 is a diagram showing a process to manufacture an element unit.
Figure 4:
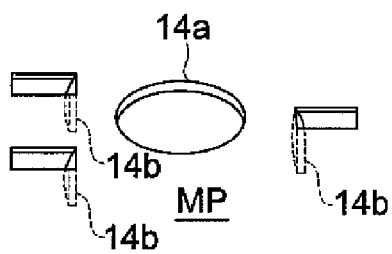
FIG. 4 is a diagram showing a process to manufacture an element unit.

Next, a manufacturing method of the imaging device related to the present embodiment will be described as follow. FIGS. 3 to 8 are diagrams to show manufacturing processes of the imaging device 50. For convenience, in FIGS. 5 to 7, only two lenses are shown, however, in practice, the lenses are disposed in an array as FIG. 3 shows. First, a metal plate material MP is formed by press work to punch out a plurality of the openings 14a in a shape of an array, and at the same time, leg sections 14b are formed by punching and bending as FIG. 4 shows. FIG. 4 is a magnified view of the metal plate material MP. Incidentally, at the circumference of one opening 14a, three log sections 14b having a prescribed length are formed, extending downward in parallel.

Figure 5:
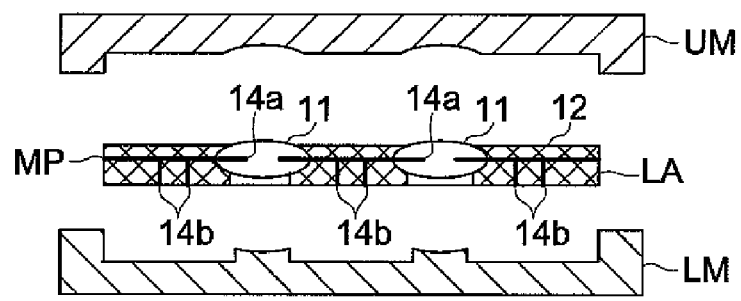
FIG. 5 is a diagram showing a process to manufacture an element unit.

Next, as FIG. 5 shows, by disposing the metal plate material MP having been pressed in an upper mold UM and a lower mold LM, a lens array LA including the metal plate material MP is formed through insert molding. When this occurs, the lens 11 and the lens frame 12 can be formed with different resin materials using tow-color molding which is disclosed in Unexamined Japanese Patent Application Publication No. 2007-1365, wherein at least the opening 14a is included in the transparent resin material. When this occurs, the leg sections 14b are not protruding from the lower surface of the lens array LA but only the front end of the leg thereof is exposed. Here, by regulating a length L1 of the leg section 14b, the lower surface of the lens array LA can contact with an upper surface of an imaging element array IA, whereby the image sensor 51 of the imaging element array IA corresponding to each lens 11 of the lens array LA can be positioned in the prescribed range in an optical axis direction, and as a result, a job such as focusing can be simplified. Incidentally, the prescribed range means the range of about ±F×2P (F: lens F number, P: pixel pitch of imaging element) in an air equivalent length, in which a deviation between the light receiving surface of the image sensor 51 and an imaging point of the lens 11 falls. For positioning within the prescribed range, the lower surface of the lens array LA can be grinded.

Also, the lens 11 and the lens frame 12 can be formed integrally with a transparent resin, and a part of the lens except an opening for photographing is printed by inkjet with non-transparent black ink so as to form a lese array LA.

Figure 9:
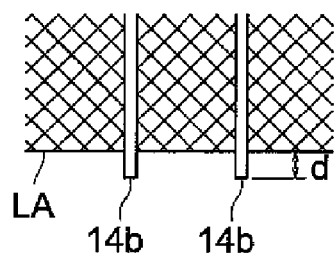
FIG. 9 is a diagram showing a part of an exemplary variation of an element unit.

In case, the lower surface of the lens array LA and an upper surface of the imaging element array IA to be described are bonded each other with an adhesive, as FIG. 9 shows, it is desirable to extrude the leg section 14b from the lower surface of the lens array LA by an amount equivalent to a thickness of the adhesive. In the above case, first, the leg section 14b is extruded so that the extruding amount exceeds the thickness d, then after insert molding, the extruding amount can be adjusted to the thickness d by grinding the lower end of the leg section 14b so as to position the leg section 14b within the prescribed range.

Figure 6:
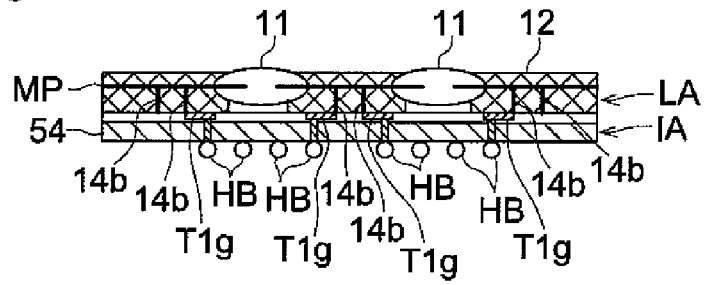
FIG. 6 is a diagram showing a process to manufacture an element unit.

On the other hand, a plurality of imaging elements are formed in the shape of the array and the imaging element array IA backed up by a resin plate 54 is formed in a separate process. Then as FIG. 6 shows, the lens array LA and the imaging element array IA are bonded. When this occur, the three leg sections 14b come into contact in a balanced manner with three earth terminals T1g among the terminals T1 disposed at the circumference of the image sensor 51 (refer to FIG. 2).

Figure 7:
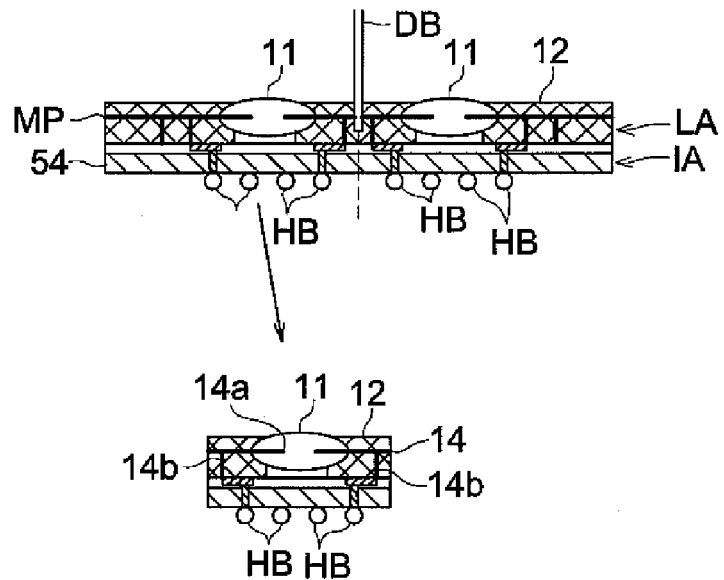
FIG. 7 is a diagram showing a process to manufacture an element unit.

Thereafter, as FIG. 7 shows, the lens array LA and the imaging element array IA having been bonded are cut by a rotating dicing saw to separate into individual imaging devices which are respectively provided with a pair of the lens 11 and an imaging sensor 51 (imaging element). The metal plate 14 cut at that time is exposed at the circumference of the imaging device.

Figure 8:
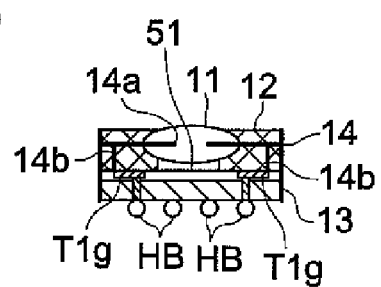
FIG. 8 is a diagram showing a process to manufacture an element unit.

Further, as FIG. 8 shows, by applying the conductive paint 13 at the outer circumference of the imaging device, the conductive paint 13 covers the outer circumference of the lens frame 12. When this occurs, since the conductive paint 13 contacts with the exposed metal plate 14 as well, the conductive paint 13 communicates with the earth terminal Tg1 via the leg sections 14b. Whereby, since the circumference of the image sensor 51 is surrounded by the conductive paint 13, highly effective shielding is realized.

Incidentally, instead of the conductive paint 13, a metal cylinder can be fitted.

After that, the unillustrated substrate, on which solder ball HB intervenes, is conveyed to the reflow bath so as to carry out installation of the imaging device 50.

According to the present embodiment, by insert molding of the metal plate material MP so as to include the opening 14a in the transparent resin, the opening 14a serves as a diaphragm, thus a separate member is not necessary to be assembled as the diaphragm. Whereby the labor of assembling can be saved. Further, by assembling the lens array LA with the imaging element array IA while contacting the leg section 14b with the terminal T1g, the shield of the imaging element can be grounded, which also saves the labor of connecting wires by soldering, thus the labor of assembling can be saved. In addition, by adjusting the length L1 of the leg section 14b in advance, the lens 11 and the image sensor 51 can be positioned in the prescribed range in the optical axis direction, whereby only by bonding the lens array LA with the imaging element array IA, the imaging sensor 51 can be disposed at a focus position of the lens 11. Therefore, the labor of adjustment can be saved.

In the forgoing, while the present invention has been described with reference to the embodiments, it is to be understood that the present invention is not limited to the embodiments thereof and changes and variations may be made. The imaging lens can be configured with a single lens or a plurality of lenses.

What is claimed is:

1. An imaging device disposed on a substrate, comprising:
    an imaging element mounted on the substrate, provided with a light receiving surface on which pixels are disposed;
    a lens to form an image of an object on the light receiving surface of the imaging element; and
    a conductive diaphragm member which has an inner part included within the lens, and an outer part being outside the lens,
    wherein the diaphragm member is connected with an earth terminal of the substrate.

2. The imaging device of claim 1, further comprising a frame made of resin material, including the diaphragm member therein, wherein an inner part of the diaphragm member protrudes from the frame.

3. The imagining device of claim 2, wherein the lens is positioned by the frame at a distance from the imaging element in an optical axis direction within a predetermined range.

4. The imaging device of claim 2, wherein the frame is made of black resin material.

5. The imaging device of claim 2, wherein an outer surface of the frame is painted with a conductive paint.

6. The imaging device of claim 1, wherein the diaphragm member has three leg sections connecting with the earth terminal of the substrate.

7. A lens unit, comprising:
- a lens for forming an image,
- a conductive diaphragm which has an inner part included within the lens, and an outer part being outside of the lens, and
- a frame made of a black resin having a through hole in which the lens is inserted,
- wherein the outer part of the diaphragm is included within the frame and a tip of the outer part of the diaphragm is exposed as an electric terminal.

8. The lens unit of claim 7, wherein the frame overlaps with the lens in an optical axis direction.

9. A lens array, comprising:
- a plurality of lenses,
- a conductive plate having first parts in which a plurality of first through holes are formed wherein the first parts of the conductive plate are included within the lens corresponding thereto, and
- a frame made of a black resin having a plurality of second through holes, to which the corresponding lenses are inserted respectively,
- wherein a second part other than the first parts of the plate is included within the frame and a tip of the second part of the plate is exposed as an electric terminal.

10. The lens array of claim 9, wherein the lenses are disposed in a matrix arrangement.

* * * * *